(12) United States Patent
Randolph (10) Patent No.: US 9,519,734 B2
(45) Date of Patent: Dec. 13, 2016

(54) SYSTEMS AND METHODS FOR IMPROVED PROPERTY INSPECTION MANAGEMENT

(71) Applicant: UScope Technologies, Inc., Atlanta, GA (US)

(72) Inventor: Earl Randolph, Atlanta, GA (US)

(73) Assignee: UScope Technologies, Inc., Atlanta, GA (US)

( * ) Notice: Subject to any disclaimer, the term of this patent is extended or adjusted under 35 U.S.C. 154(b) by 0 days.

(21) Appl. No.: 14/883,620

(22) Filed: Oct. 15, 2015

(65) Prior Publication Data

US 2016/0110480 A1 Apr. 21, 2016

Related U.S. Application Data

(60) Provisional application No. 62/177,020, filed on Oct. 15, 2014.

(51) Int. Cl.
| | |
|---|---|
| *G06K 9/64* | (2006.01) |
| *G06F 17/50* | (2006.01) |
| *G06T 3/00* | (2006.01) |
| *G06T 11/20* | (2006.01) |

(52) U.S. Cl.
CPC .............. *G06F 17/5004* (2013.01); *G06T 3/00* (2013.01); *G06T 11/20* (2013.01); *G06T 2210/04* (2013.01)

(58) Field of Classification Search
None
See application file for complete search history.

(56) References Cited

U.S. PATENT DOCUMENTS

| | | | | |
|---|---|---|---|---|
| 7,047,014 | B1* | 5/2006 | Friday | H04W 16/18 345/581 |
| 9,053,566 | B1* | 6/2015 | Riggs | G06T 11/00 |
| 2009/0189902 | A1* | 7/2009 | Bowkett | G06T 11/206 345/441 |
| 2009/0245678 | A1* | 10/2009 | Ming | G06T 5/30 382/257 |
| 2010/0275018 | A1* | 10/2010 | Pedersen | G06T 19/00 713/168 |
| 2013/0179206 | A1* | 7/2013 | Harper | G06F 17/5004 705/7.13 |

(Continued)

FOREIGN PATENT DOCUMENTS

JP 05089142 A * 4/1993

OTHER PUBLICATIONS

Shio, Akio, and Yasuhiro Aoki. "Sketch plan: a prototype system for interpreting hand-sketched floor plans." Systems and Computers in Japan 31.6 (2000): 10-18. 9 pages.*

(Continued)

*Primary Examiner* — Sumati Lefkowitz
*Assistant Examiner* — Ryan P Potts
(74) *Attorney, Agent, or Firm* — Clayton, McKay & Bailey, PC (57) ABSTRACT

Systems and methods presented herein can allow an inspector or other user to sketch a floor plan on a customized graph template. The graph template can be customized by a system based on the property the user is visiting. The user can take a picture of the customized graph template with a mobile computing device. An application executing on the mobile computing device or a server can transform the sketch in the picture into a floor plan.

19 Claims, 9 Drawing Sheets

(56) References Cited

U.S. PATENT DOCUMENTS

2014/0267717 A1* 9/2014 Pitzer .................. G06F 17/5004
348/143

OTHER PUBLICATIONS

Su, Feng, Jiqiang Song, and Shijie Cai. "A vectorization system for architecture engineering drawings." Graphics Recognition. Ten Years Review and Future Perspectives. Springer Berlin Heidelberg, 2005. 11-22. 12 pages.*
Ahmed, Sheraz, et al. "Automatic analysis and sketch-based retrieval of architectural floor plans." Pattern Recognition Letters 35 (2014): 91-100. 10 pages.*

* cited by examiner

SYSTEMS AND METHODS FOR IMPROVED PROPERTY INSPECTION MANAGEMENT

CROSS REFERENCE TO RELATED APPLICATION

This non-provisional patent application claims the benefit of priority to provisional application No. 62/177,020 ("E Z SketX Graph File Folder System"), filed Oct. 15, 2014, which is hereby incorporated by reference in its entirety.

BACKGROUND

Inspectors for insurance or contracting companies routinely visit homes and other buildings to assess damage and estimate repair costs. During each visit, the inspector usually sketches a floor plan and makes notes about various areas of the home. The inspector then takes these sketches back to an office, and recreates the floor plans in computer software for use in preparing an actual estimate.

However, there are several drawbacks to this common approach. First, it takes significant time to recreate a sketched floor plan in existing computer software. Practically speaking, the inspector must do the work twice: first sketching the floor plan in a notebook onsite, and then later manually recreating the floor plan in a computer system. The floor plan can be required as part of determining an insurance adjustment quote or repair estimate. Recreating the sketch can drastically prolong the inspector's workday.

Because of the time involved in recreating the sketches, inspectors often end up carrying around their notes for extended periods until they have an opportunity for recreating the sketches. Because sketches are commonly drawn on paper, a risk exists for the notes being lost or damaged. Often, an inspector uses a notebook, which can increase the risk. Notes are subjected to rain and the elements when the inspector is examining exterior features of a property. Other notes regarding the property similarly can be lost, damaged, or destroyed in the time that lapses before the notes are entered into a computer system.

In many situations, it is not a viable option to directly sketch the floor plan into a computer system with a mobile computing device while onsite. Cell phone screens can be too small for a user to accurately sketch a floor plan. Tablets are often too bulky for certain jobs. For example, when assessing a damaged roof, the inspector might be required to get on top of the house to take measurements. If the inspector drops their tablet, it can slide off the roof and be destroyed. Because of the high breakage risk, it is usually cost prohibitive for a company to outfit a team of inspectors with mobile computing devices for onsite assessments. Therefore, paper-based notes and the attendant shortcomings have remained the norm for inspectors.

Therefore, a need exists for systems and methods for improved property inspection management.

SUMMARY

An example described herein includes systems and methods for improved property inspection management. In one example, a system generates a first graph template for printing from a user device. The first graph template can include an information region and a graph region for the user to fill in during a property inspection. The information region can include an inspection checklist. The graph region can provide grid lines for sketching room, roof, or building dimensions (e.g., a sketched floor plan).

The first graph template can be generated by a server in communication with a user device, based on a property that a user is scheduled to visit. In one example, a server prioritizes properties for a user to visit. The server can custom-generate different graph templates for the different properties based on known information about the properties or purposes for visiting the property. Using an inspection application executing on the user device, the user can print the first graph template from the user device.

At the jobsite, the user can use the printed first graph template to collect information about the property. This can include making notes, annotations, or completing an inspection checklist in the information region. The system can customize the information region to ensure that the user collects the right types of information based on, for example, a particular insurance claim. The user can further annotate the first graph template by sketching a floor plan in the graph region. The floor plan can indicate interior rooms of a property or roof dimensions of a property.

Using the inspection application, the user can capture a photograph of the annotated first graph template. A photograph is understood to mean any digital image or picture of the first graph template. The inspection application can analyze the photograph to retrieve a property characteristic from the information region based on the user's annotations. The information region can include an inspection checklist, and a checklist item can be a property characteristic. This can occur either on the user device or on a server to which the inspection application connects. The inspection application can further vectorize the graph region to transform the user's sketch into a floor plan.

The system can further add computer-generated annotations to the floor plan. For example, the system can provide dimension information based on a scale applied to the graph region. The scale can be defined by the user in the information region in one example. The system can also label rooms in the floor plan, for example, by detecting annotation codes supplied by the user in the sketch.

The server can then store the property characteristic with the floor plan. This can allow the server to make additional adjustment calculations, and provide the floor plan, property characteristic, and other property information as part of an inspection or estimation report.

The system, therefore, can greatly reduce the risk of information loss compared to current technologies. It can also greatly improve efficiencies compared to current estimation and floor plan generation processes.

It is to be understood that both the foregoing general description and the following detailed description are exemplary and explanatory only and are not restrictive of the embodiments, as claimed.

BRIEF DESCRIPTION OF THE DRAWINGS

The accompanying drawings, which are incorporated in and constitute a part of this disclosure, illustrate various examples and together with the description, serve to explain the principles of the disclosure. In the drawings.

DESCRIPTION OF THE EXAMPLES

Reference will now be made in detail to the present examples, including examples illustrated in the accompanying drawings. Wherever possible, the same reference numbers will be used throughout the drawings to refer to the same or like parts.

Figure 1:
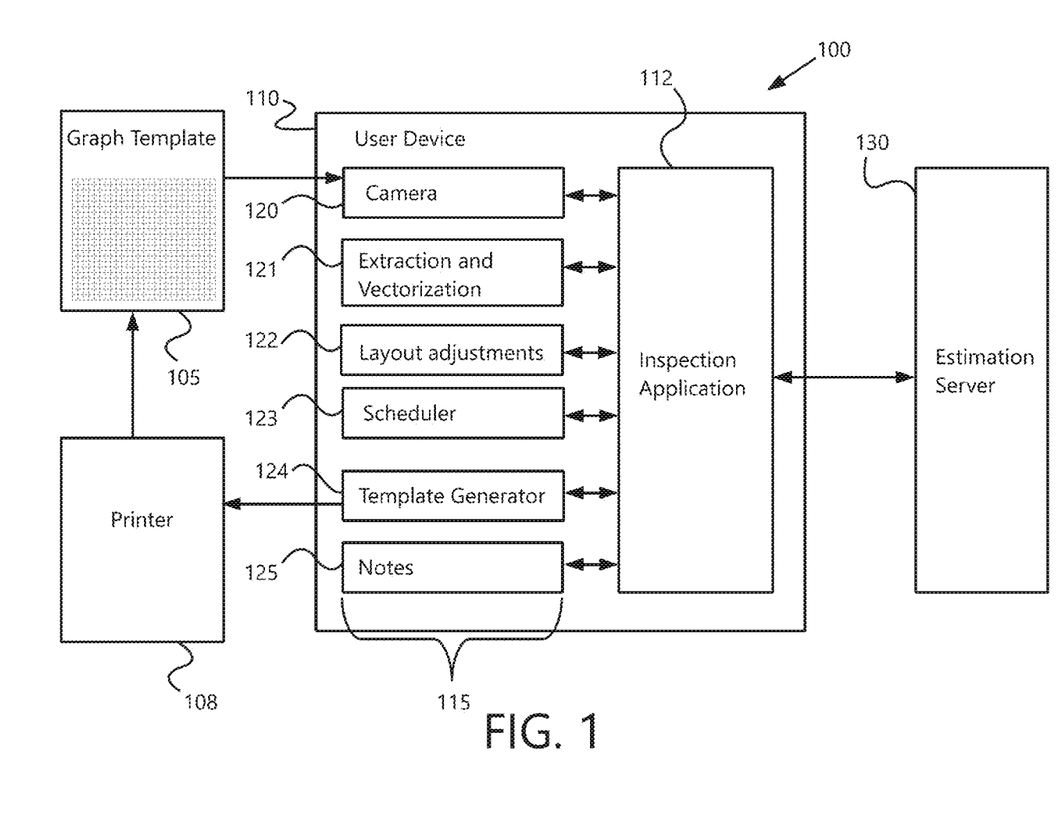
FIG. 1 is an exemplary illustration of a system for improved property inspection management.

FIG. 1 shows an exemplary illustration of a system 100 for improved property inspection management. The system 100 can manage the floor plan generation process for the purposes of insurance adjustment and other estimates. In one example, a system 100 generates a graph template 105 that the user prints and annotates by sketching a floor plan and provide additional property information. The system 100 reads the graph template 105 to collect the property information and sketch, converting both into information used at an estimation server 130.

The user can be an inspector, such as an appraiser or insurance adjuster. The user can use a user device 110 for some of the system functions. The user device 110 can be a mobile computing device, such as a cell phone, tablet, laptop, or smart camera. The user device 110 can include a camera component for taking a picture (e.g., photograph) of an annotated graph template.

In one example, an inspection application 112 executes on the user device 110. The inspection application 112 can communicate over a network with an estimation server 130. The network can be the Internet, a cellular network, a local area network, a workstation peer-to-peer network, a direct link network, a wireless network, or any other suitable communication platform. The inspection application 112 can include multiple functions 115. Any of the functions 115 can alternatively be partially or fully executed on the estimation server 130 in an example.

The inspection application 112 can include a template generator 124 function for generating graph templates 105. The template generator 124 can generate a graph template 105 for use by the user in evaluating a property. As explained more thoroughly with regard to FIG. 2, below, the graph template 105 can include an information region and a graph region. The information region can include any portion of the graph template that includes options for user selection regarding the property. The user can sketch in the graph region, and provide information about the property in the information region.

The graph template 105 can be printed by a printer 108 in one example. Printing can be triggered by the inspection application 112 on the user device 110. The graph template 105, therefore, can be physically represented on a piece of paper. In one example, specialized paper already having some or all of the information region and graph region is used as print media. The specialized paper can already include an information region with blank areas for filling during printing. It can also include a graph region with a grid. This can help ensure that the grid is of a particular color that can assist the system 100 with processing the sketch at a later stage. The specialized paper can be weather resistant in one example. In one example, the specialized paper can include a sticker layer that the user can peel off and attach to a folder or other media. In yet another example, the graph template 105 can be printed directly onto a folder.

Therefore, generating the graph template 105 can include providing information for printing onto a specialized paper in one example.

In one example, the template generator 124 customizes the graph template 105 for a particular property that the user is scheduled to visit. This can include generating custom property information (e.g., property characteristics) in the information region. This can include custom input options that the user fills out while onsite at the property. This can help ensure that the user collects the relevant data for that particular property, based on the property and the task being performed at the property.

The inspection application 112 can determine how to customize the graph template 105 by communicating with the estimation server 130 in one example. The estimation server 130 can execute a backend component that can communicate with the inspection application 112. The estimation server 130 can access a database to provide property information and/or user information to the inspection application 112 for user in the graph template 105.

In one example, the estimation server 130 schedules a plurality of properties that the user will visit that day based on the information in the database. The estimation server 130 can communicate property information and sequencing for the plurality of properties to the inspection application 112. Alternatively, the inspection application 112 can include a scheduler function 123 that can sort which property the user should visit first. Then, the template generator 124 can generate and print the graph templates 105 in sequence.

The graph templates 105 can be customized by the system 100 to include property-specific information in the information region. The property-specific information can identify the property address, the scheduled time for arrival, and the sequencing respective to the other properties that the user is scheduled to visit that day.

The template generator 124 can also provide custom options that require input from the user based on examination of the property. For example, the information region can be customized to include options relevant to a homeowner insurance inquiry particular to a first property. In this way, the graph template 105 can be customized to prompt the user to collect relevant information while at the property (e.g., onsite).

Additionally, the user can sketch a floor plan in the graph region. This can include annotating the sketch with symbols to indicate elements such as windows and doors, or particular rooms.

Once the user has entered all relevant annotations, the user can take a photo of the graph template 105 with the user device 110. In one example, the inspection application 112 includes a camera interface 120 for this purpose. The camera interface 120 can include a graphical overlay that the user can align with markings on the graph template 105. Aligning the graphical overlay can reduce picture distortion from taking a picture at an angle. The user can take the picture using the user device 110. It can also allow the inspection application 112 to reliably distinguish the graph portion from the rest of the graph template 105. In one example, the camera interface 120 automatically recognizes when the graphical overlay is properly aligned with the markings on the graph template 105, and automatically captures a photo of the graph template 105 based on the proper alignment.

Next, an extraction component 121 can gather user annotations from the photo of the graph template 105. The extraction component 121 can execute partially or fully on the user device 110 or the estimation server 130, depending on the implementation.

The extraction component 121 can gather information from the information region. To do this, the extraction component 121 can first identify the graph template 105 based on a graph template identifier. This can provide the extraction component with the X and Y coordinates where particular user annotations can be located for selecting the customized options in the information section. If a particular location is darkened, then the extraction component 121 can count the option as selected. The extraction component 121 can also utilize text recognition technology to read handwritten notes at designated locations.

The extraction component 121 can also include a vectorizer method. The vectorizer method can perform a series of stages for adjusting the photograph for machine reading and converting the hand-drawn sketch into a vectorized floor plan. The photograph adjustments can be applied to the entire graph template 105 or just the graph region, depending on the implementation. Then, the vectorizer method can include a series of graphical manipulations that allow the user device 110 or estimation server 130 to recognize lines drawn by the user. The recognized lines are used to generate the vector floor plan. An example vectorizer method is more thoroughly explained below with regard to FIG. 5. An example illustration is also provided in FIG. 4A.

Continuing with FIG. 1, in one example, the extraction component 121 can recognize text written into the sketch by the user. The text can include codes that designate particular rooms or other information in the sketch. The extraction component 121 can convert the codes into text that is stored with the vectorized floor plan. This can include storing coordinates for the text, or graphically inserting the text into the floor plan and storing the graphical representation of the floor plan.

The inspection application 112 can provide additional functions for adjusting the information collected during extraction 121. For example, the user can make layout adjustments 122 in one example. This can allow a user to manually edit the vectorized floor plan. In one example, the user can open the vectorized floor plan from the estimation server 130. The user can edit the vectorized floor plan by labeling rooms or other aspects of the floor plan or by changing wall locations. The user can drag room walls to modify the floor plan in one example. The modified floor plan can then be uploaded back to the estimation server 130.

Additionally, the inspection application 112 can include a notes component 125 that allows the user to input additional notes regarding the property. These can include notes that are in addition to user notes supplied in the predefined information region of the graph template.

The inspection application 112 can send, to the estimation server 130, property information including extracted information, notes, adjustments, graph template photo, and floor plan (sketch and/or vectorized). This can allow either the user or another user (e.g., administrator, boss, or coworker) to review the collected information, add to the information, or perform additional analytics.

The system 100 can also generate reports based on the stored property information. In one example, the report gives a narration of an estimate (e.g., for repair) based on the property information extracted from the information region of the graph template. In one example, the estimation server 130 also includes an application program interface (API) that allows another server or system to connect to it and retrieve the property information for preparation of an inspection or estimation report.

In one example, the user device 110 can print a finalized inspection or estimation report. The estimation server 130 can send final information, including the stored property information and vectorized floor plan, to the user device 110.

From there, the user device 110 can print the final information using a printer 108. The final information can be printed onto the specialized paper that already includes a information region and graph region. This can entail printing the user selections and typed versions of previously handwritten text into the information region. It can also include printing the vectorized floorplan onto the grid of the graph region. In another example, the finalized inspection report is printed onto normal paper, but information from the specialized paper for graph templates is also printed onto the normal paper.

Figure 2:
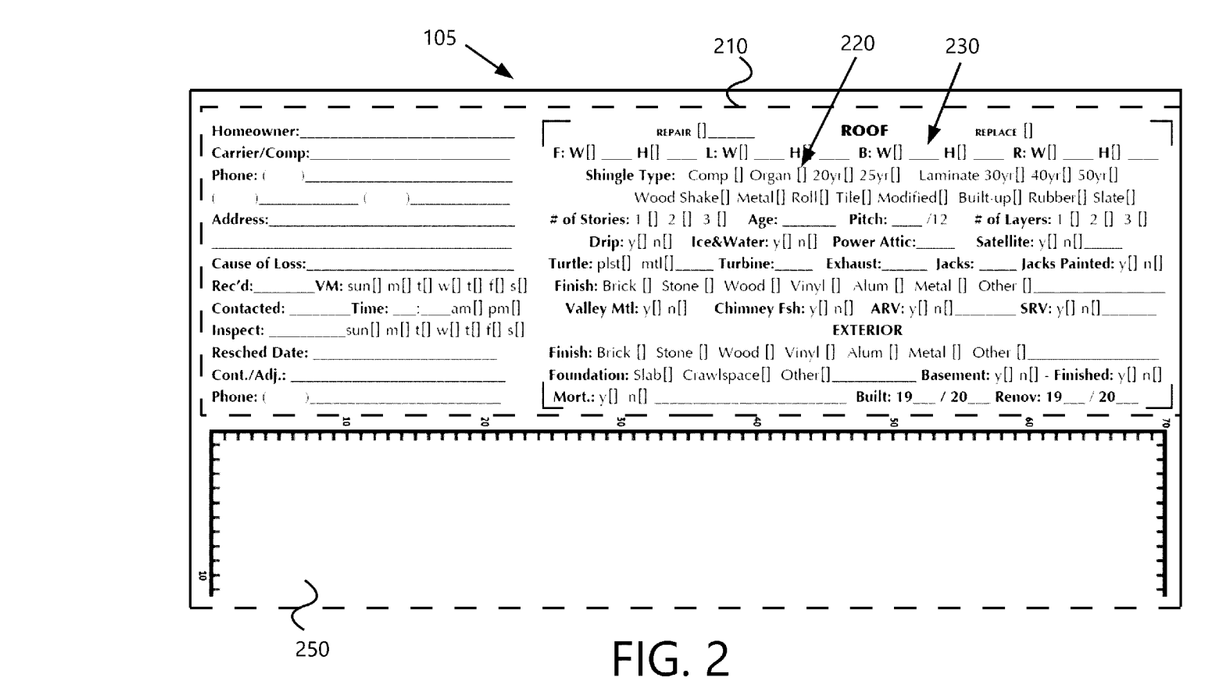
FIG. 2 is an exemplary illustration of a graph template.

Turning to FIG. 2, an example graph template 105 is illustrated. The graph template 105 can include an information region 210. The information region 210 can include options for selection by the user as part of the user's onsite analysis. In one example, these options are customized for the property and job by the system 100. As an example, the graph template 105 of FIG. 2 can be generated for a property being evaluated for an insurance claim based on roof and exterior damage. Options describing shingle type, age, pitch, layers, and other roof features can be included by the system 100. Similarly, options to describe the exterior can be included. These options can include the finish material (e.g., brick, stone, wood, vinyl, metal, and other). In this way, portions of the information region 210 can act as a checklist or questionnaire for the user to complete during analysis of the property.

Many of the options can be provided with a target 220 for the user to mark if the option applies. When the user photographs the graph template 210, the extraction component 121 can check at coordinates for each target 220 to determine if the user has selected the target.

Other options include a blank 230 for the user to write in a response. The extraction component 121 can check at coordinates for each blank 230 and perform text recognition to gather the written information.

In one example, known property information can be provided by the estimation server 130 and included by the template generator component 124 in the information region 210. Though not pictured in FIG. 2, homeowner information including the name, carrier, phone, address, and other known information can be pre-populated into the graph template 105. This can serve as notification to the user that the information already exists at the estimation server 130. The can allow the user to focus on collecting information that has not yet been gathered and does not already exist in the graph template 105.

In one example, the graph template 105 can be two-sided. The first side can include a first information region for exterior inspection and the second side can include a second information region for interior inspection. It is understood that the information region 210 can include multiple information regions.

The graph template 105 can also include a graph region 250. The graph region 250 (partially shown in FIG. 2) can include a grid that acts as a guide for the user to sketch a floor plan. The floor plan can include dimensions of rooms relevant to the estimation task. Alternatively, the floor plan can consist of roof dimensions relevant to the estimation task.

An information region 210 above, beside, or below the graph region 250 can include options that identify what is being illustrated. For example, if the property has multiple floors, then the information region 210 can include an option for each floor. The user can select the floor that they are sketching. A graph template 105 can include multiple pages for a single property when the system 100 detects that there are multiple floors.

The information region 210 can also allow the user to select a scale for applying to the grid. This can allow the system 100 to interpret the dimensions of the lines drawn by the user. In one example, the system 100 sets the scale automatically based on property information regarding a structure size. In that example, the printed graph template 105 can already indicate the scale.

Figure 3:
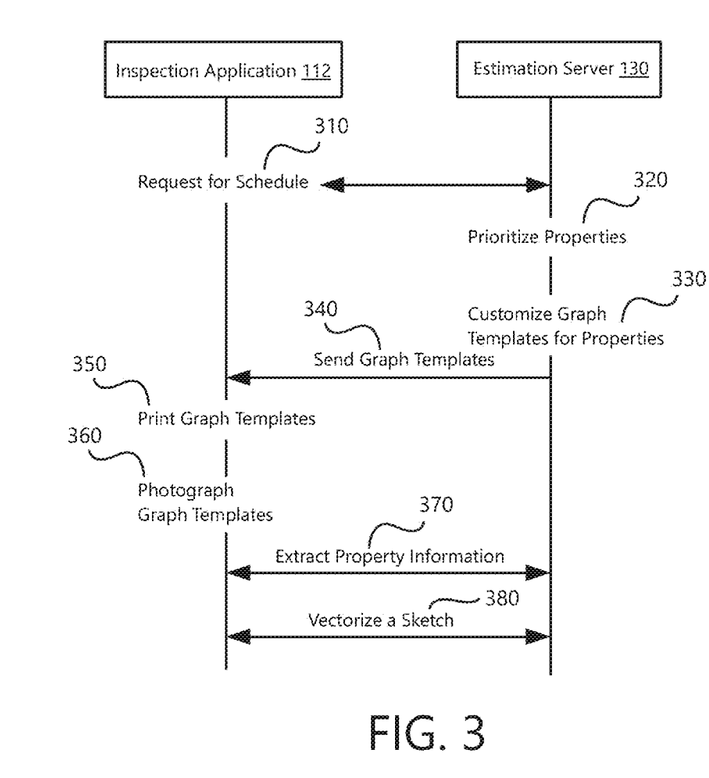
FIG. 3 is an exemplary flow chart with example stages for scheduling property visits and generating a floor plan.

FIG. 3 includes an exemplary illustration of stages performed between an inspection application 112 and estimation server 130. At stage 310, the inspection application 112 can request a schedule of properties to visit from the estimation server 130. The request can incorporate calendar information available at the user device 110. For example, if the user has particular times and locations already scheduled, this information can be provided to the estimation server 130. The request can occur automatically at a scheduled time during the night or each morning in an example.

In response to the request, at stage 320 the estimation server 130 can prioritize the properties. This can include pulling open jobs from a database based on the user's skill group and location. A skill group can indicate a group of tasks the user is capable of performing. Jobs stored in the database can include a skill group identifier to describe the level of employee that will be needed for the job. The job location can be the property location. The estimation server 130 can attempt to assign a plurality of properties, sequenced such that adjacent properties in the sequence are located relatively near to one another. In another embodiment, the jobs are sequenced by the inspection application 112 at the user device 110.

At stage 330, the estimation server 130 can customize graph templates 105 for one or more of the prioritized properties. In one example, this includes providing property information from the database in the information region of the graph template 105. It also include providing custom options based on the property information or job information. Other customizations include setting the scale of the grid in the graph region based on square footage information for the property. In another example, stage 330 is performed at the inspection application 112 based on property information received from the estimation server 130.

At stage 340, the estimation server 130 sends the graph templates to the inspection application 112. This can include sending images to print in one example. In another example, this includes sending data, such as property information, to the inspection application 112 that the inspection application 112 can use to assemble a customized graph template.

The estimation server 130 can alternatively or additionally send a schedule of properties to the user device 110. The schedule can be sent over email in one example, and incorporated into a calendar application on the user device 110.

At stage 350, the inspection application 112 can print the graph templates. The graph templates can be printed in order based on an optimal visitation sequence for the plurality of properties. This can allow the user to take a stack of graph templates 105 that are pre-organized for the day's tasks. Printing can also include printing multiple sheets for properties known to have multiple levels that will need to be independently sketched.

After the onsite portion of a job is complete, at stage 360 the user can photograph the graph templates. This can include lining up markers on a graph template 105 with guide graphics in a camera module 120 of the inspection application 112. The same or additional grid markers can be used by the inspection application 112 during extraction and vectorization 121. For example, grid markers (e.g., numbers, symbols, colored lines, or dashes at the border of the grid) can allow the inspection application 112 to interpret the scale and location of a portion of the sketch within the graph region 250.

At stage 370, the inspection application 112 and/or estimation server 130 can extract property information. In one example, a code or other information in the graph template 105 can be used by the system 100 to determine which coordinates to check for property information. This can allow the system 100 to read different graph templates 105 that collect different information. The system 100 can check all of the applicable coordinates, reading text where applicable.

In one example, the inspection application 112 extracts a property characteristic from the information region. The property characteristic can be a selection in an inspection checklist.

At stage 380, the inspection application 112 and/or estimation server 130 can vectorize a sketch located in the graph region 250. This can include one or more of the steps in FIG. 6 in an example. In one example, perspective modifications are performed prior to or as part of stages 370 or 380 to account for image distortions and curvature of the graph template 105 in the picture.

In one example, the picture or information recognized in the picture is sent to the estimation server 130 or some other server for vectorization and machine reading. The inspection application 112 can extract some information but leave more intensive processes to be performed at a server. Once the vectorization is complete, the floor plan and property information can be sent to the inspection application 112 or the estimation server 130.

Figure 4A:
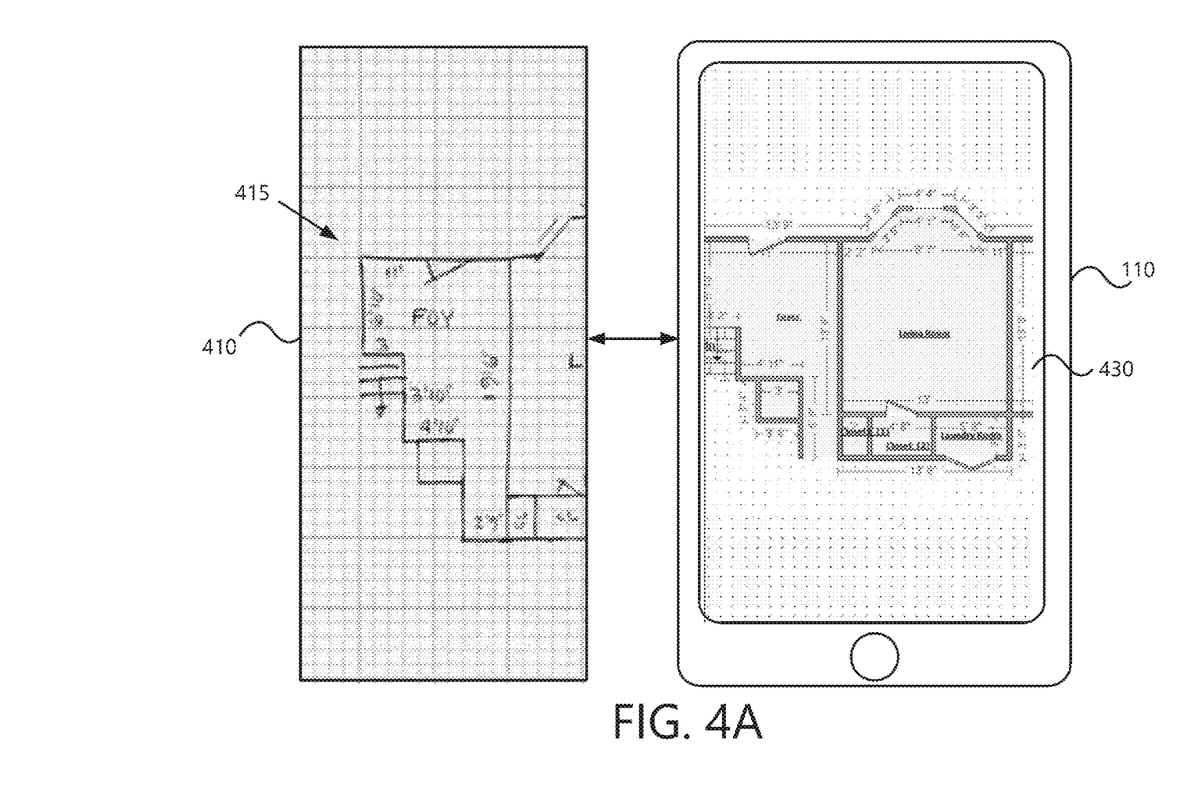
FIG. 4A is an exemplary illustration of a graph region that is converted into a floor plan.

An example illustration of the vectorization is shown in FIG. 4A. A partial graph region 410 includes a hand-drawn sketch 415 by the user. The sketch can generally follow the gridlines of the graph region 410, which can allow the inspection application 112 to accurately track relative positions and sizes.

Codes can be recognized as identifying the type of room. In this example, "FOY" stands for Foyer. Other symbols for doors and windows can also be recognized by the inspection application 112 and/or estimation server 130.

As a result of vectorization, the sketch 415 can be transformed into a vectorized floor plan 430 and displayed on the computing device 110. The vectorized floor plan can include clean lines, room identifiers based on codes provided by the user, and wall dimensions. Similar output is possible based on floor plans that are room dimensions.

Figure 4B:
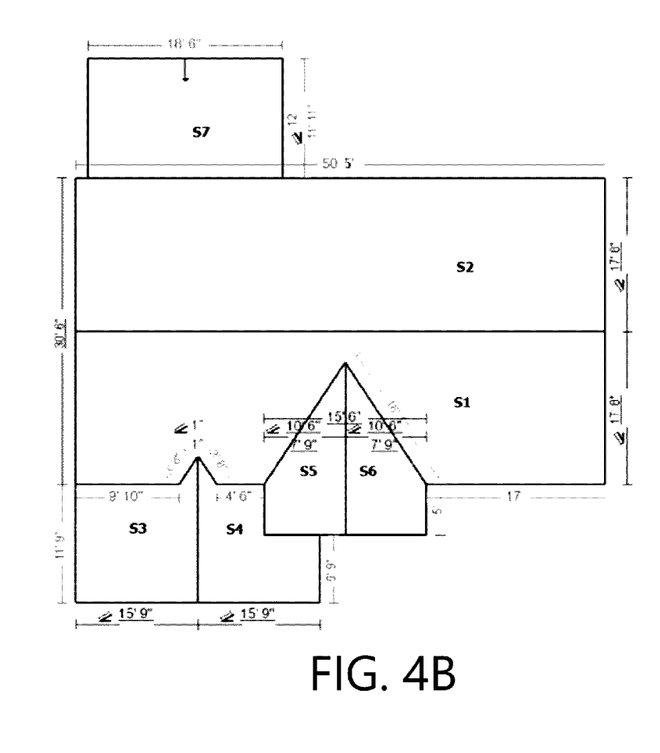
FIGS. 4B-4D are exemplary illustrations of a converted floor plan.
Figure 4C:
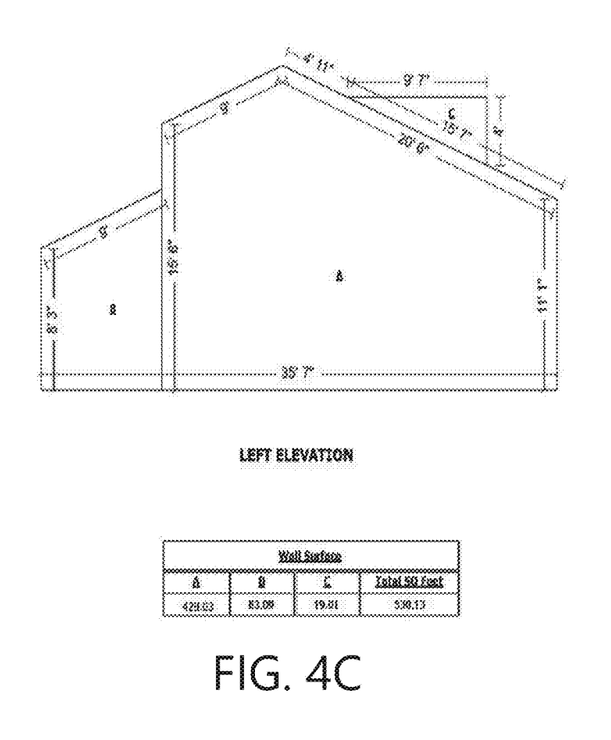
Figure 4D:
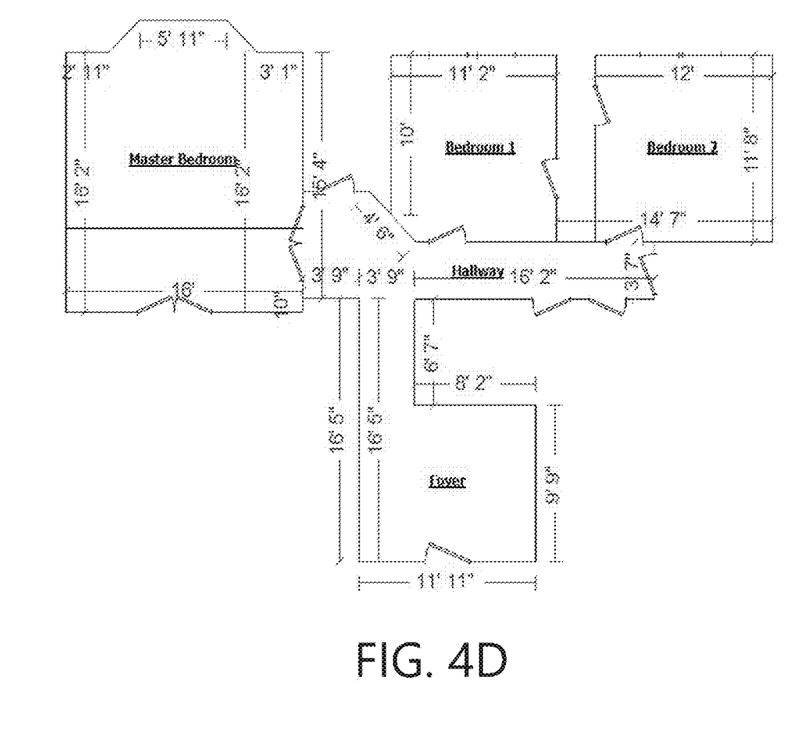

FIGS. 4B-4D illustrate an additional vectorized floor plan. As used herein, the floor plan can include roof layout, as shown in FIG. 4B. The floor plan can also include an elevation layout, as shown in FIG. 4C. Further, it can include a room layout, as shown in FIG. 4D. It is to be understood that a vectorized floor plan can include one or more of a roof layout, elevation layout, or floor layout.

Figure 5:
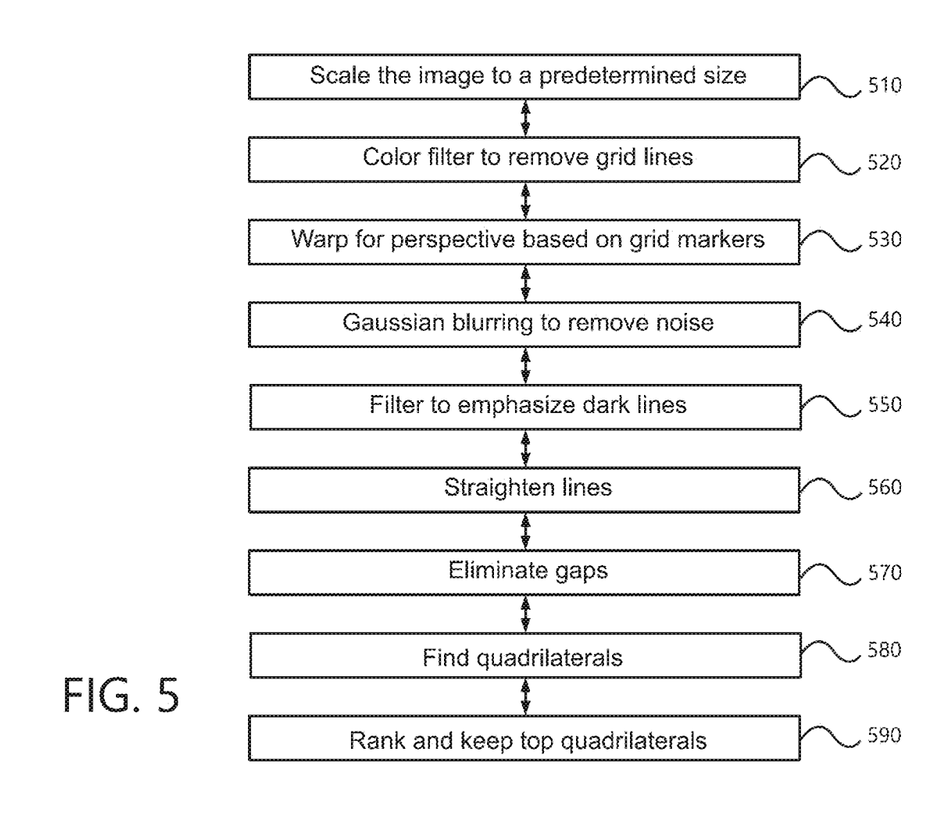
FIG. 5 is an exemplary method.

FIG. 5 illustrates exemplary stages for vectorizing a sketch to create a floor plan in one example. The stages can be performed by a one of or a combination of the inspection application 112 and the estimation server 130. As used herein, "vectorizing" can include one or more stages of FIG. 5, and generally includes detecting lines that are drawn as part of the sketch.

At stage 510, the system 100 can scale the image (e.g., photograph) to a predetermined size. This can include analyzing the image resolution and dimensions, and adjusting the resolution and dimensions to meet a predetermined size. By working with a predetermined size and dimensions, the system 100 can more consistently identify lines in the sketch that belong in the floor plan.

At stage 520, the system 100 can apply a color filter to remove grid lines. The color filter can be set to eliminate the specific color of the gridlines, including variations attributable to lighting conditions. In one example, the color filter can be calibrated for the camera on a particular user device 110 by the user taking a picture when the grid is empty. The inspection application 112 can analyze the empty grid lines to determine the color setting for the color filter.

At stage 530, the system 100 can warp the image perspective based on grid markers. This can include locating grid markers at the corners of the grid in one example. The image can be scaled such that the corner grid markers are brought into a predetermined spatial relationship from one another (e.g., forming a rectangle). The image is further stretched and skewed to align grid markers between the corners into horizontal or vertical lines. This can help eliminate distortion caused by picture angle or a graph template 105 page that was curved instead of flat during picture taking. This stage can be performed alternatively or additionally after quadrilaterals are recognized in stage 580.

At stage 540, the system 100 can apply Gaussian blurring to remove noise and artifacts. Some noise and artifacts can be introduced during the scaling stage 510. The Gaussian blurring can include choosing a Nyquist limit based on analysis of the frequency components of the image.

At stage 550, the system 100 can apply a filter to emphasize dark (e.g., thick) lines. A first set of filters can be applied to recognize horizontal and vertical lines. These lines can be weighted as likely to be lines sketched by the user. Another filter can be applied to recognize adjacent pixels that are darker than first and second thresholds. If the adjacent pixel is darker than the first threshold, it can be part of a line. If the adjacent pixel is darker than the second threshold it is decided to be part of the line. This can cause the vectorizer component to also weight pixels along the line that only pass the first threshold as part of the line.

At stage 560, the system 100 can straighten the lines. An algorithm can create a line by determining that a line point is within a deviation threshold from a sketch pixel while maintaining a straight line.

At stage 570, the system 100 can eliminate gaps by detecting aligned line segments. For example, gaps that exist between segments that could otherwise form a continuous straight line are recognized. These gaps can be filled by connecting the segments into a continuous line. Spikey lines or lines with small off-shoots can also be ignored or corrected to result in a continuous line. The spikey lines can be the result of part of the grid being scanned as part of the sketch. For example, numeric grid borders can form spikey lines in the picture.

At stage 580, the system 100 can find quadrilaterals. This can include finding shapes that are formed by connected by straight lines. Quadrilaterals are also identified by determining fillable shapes in one example.

At stage 590, the system 100 can rank and keep a threshold number of quadrilaterals. The rankings can be based on darkness, the fewest gaps, and the most horizontal and vertical lines.

This can result in a vectorized floor plan. The inspection application 112 can then add labels, such as room labels and dimensions to the vectorized floor plan in an example.

Figure 6:
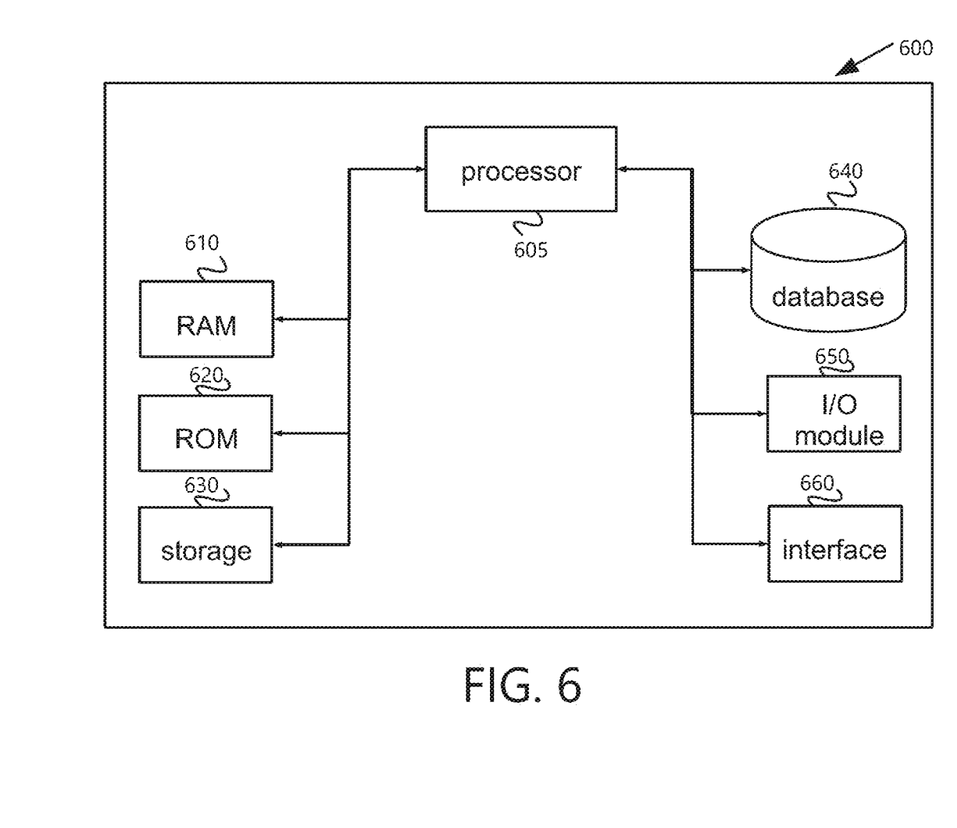
FIG. 6 is an exemplary illustration of system components.

FIG. 6 depicts an exemplary processor-based computing system 600 representative of the type of computing system that can be present in or used in conjunction with an adjustment server 130 or a computing device 110 of FIG. 1. The computing system 600 is exemplary only and does not exclude the possibility of another processor- or controller-based system being used in or with one of the aforementioned components. Additionally, a computing device or system need not include all the system hardware components in an example.

In one aspect, system 600 can include one or more hardware and/or software components configured to execute software programs, such as software for storing, processing, and analyzing data. For example, system 600 can include one or more hardware components such as, for example, processor 605, a random access memory (RAM) module 610, a read-only memory (ROM) module 620, a storage system 630, a database 640, one or more input/output (I/O) modules 650, and an interface module 660. Alternatively and/or additionally, system 600 can include one or more software components, such as a computer-readable medium including computer-executable instructions for performing methods consistent with certain disclosed examples. It is contemplated that one or more of the hardware components listed above can be implemented using software. For example, storage 630 can include a software partition associated with one or more other hardware components of system 600. System 600 can include additional, fewer, and/or different components than those listed above. It is understood that the components listed above are exemplary only and not intended to be limiting.

Processor 605 can include one or more processors, each configured to execute instructions and process data to perform one or more functions associated with system 600. The term "processor," as generally used herein, refers to any logic processing unit, such as one or more central processing units (CPUs), digital signal processors (DSPs), application specific integrated circuits (ASICs), field programmable gate arrays (FPGAs), and similar devices. As illustrated in FIG. 6, processor 605 can be communicatively coupled to RAM 610, ROM 620, storage 630, database 640, I/O module 650, and interface module 660. Processor 605 can be configured to execute sequences of computer program instructions to perform various processes, which will be described in detail below. The computer program instructions can be loaded into RAM for execution by processor 605.

RAM 610 and ROM 620 can each include one or more devices for storing information associated with an operation of system 600 and/or processor 605. For example, ROM 620 can include a memory device configured to access and store information associated with system 600, including information for identifying, initializing, and monitoring the operation of one or more components and subsystems of system 600. RAM 610 can include a memory device for storing data associated with one or more operations of processor 605. For example, ROM 620 can load instructions into RAM 610 for execution by processor 605.

Storage 630 can include any type of storage device configured to store information that processor 605 can need to perform processes consistent with the disclosed examples.

Database 640 can include one or more software and/or hardware components that cooperate to store, organize, sort, filter, and/or arrange data used by system 600 and/or processor 605. For example, database 640 can include user account information, property information, device settings, and other user preferences or restrictions. Alternatively, database 640 can store additional and/or different information. Database 640 can also contain a plurality of databases that are communicatively coupled to one another and/or processor 605, which can be one of a plurality of processors utilized by a server or computing device.

In one example, the database 640 can include one more tables that store a property identifier, property description information, a job identifier, job information, user information (e.g., skill group), a graph template identifier, and graph template attributes. In one example, a separate table links a property identifier to a graph template identifier. A table can also link a user identifier to one or more property identifiers, job identifiers, and graph template identifiers.

I/O module 650 can include one or more components configured to communicate information with a user associated with system 600. For example, I/O module 650 can include a console with an integrated keyboard and mouse to allow a user to input parameters associated with system 600. I/O module 650 can also include a display including a graphical user interface (GUI) for outputting information on a monitor. I/O module 650 can also include peripheral devices such as, for example, a printer 108 for printing information associated with system 600, a user-accessible disk drive (e.g., a USB port, a floppy, CD-ROM, or DVD-ROM drive, etc.) to allow a user to input data stored on a portable media device, a microphone, a speaker system, or any other suitable type of interface device.

Interface 660 can include one or more components configured to transmit and receive data via a communication network, such as the Internet, a local area network, a workstation peer-to-peer network, a direct link network, a wireless network, or any other suitable communication platform. For example, interface 660 can include one or more modulators, demodulators, multiplexers, demultiplexers, network communication devices, wireless devices, antennas, modems, and any other type of device configured to enable data communication via a communication network.

It is to be understood that both the foregoing general description and the following detailed description are exemplary and explanatory only and are not restrictive of the examples, as claimed.

Other examples of the invention will be apparent to those skilled in the art from consideration of the specification and practice of the invention disclosed herein. The terms "appraiser," "inspector," "adjuster," "estimation," and "adjustment" are not meant to limit the examples and are exemplary only. Other types of users can use the systems described herein. The example systems can apply to contexts other than insurance adjustment. It is intended that the specification and examples be considered as exemplary only, with a true scope and spirit of the invention being indicated by the following claims.

What is claimed is:

1. A non-transitory computer-readable medium containing instructions for generating a floor plan, the instructions causing a processor to perform stages including:
   generating a first graph template for a first property, wherein the first graph template includes an information region and a graph region in a single document, wherein generating the first graph template includes supplying different information selection options in the information region than in a second graph template that is generated for a second property, based on characteristics of the first property;
   capturing a photograph of the information region and graph region of the first graph template;
   analyzing the photograph to retrieve a property characteristic from the information region;
   vectorizing the graph region to transform a sketch into a floor plan; and
   storing the property characteristic with the floor plan.

2. The non-transitory computer-readable medium of claim 1, the stages further including:
   prioritizing visitation of a plurality of properties for a first user, the first and second properties being included in the plurality of properties; and
   printing the graph templates in order of priority, wherein the graph templates are generated to contain property-specific information selection options in the information region portions of the graph templates.

3. The non-transitory computer-readable medium of claim 1, wherein the graph region includes a grid with a first color, wherein the stages further include:
   eliminating lines matching the first color prior to vectorizing.

4. The non-transitory computer-readable medium of claim 1, wherein the vectorizing includes:
   scaling the graph region to a predetermined size or resolution;
   based on grid markers, warping the scaled graph region to account for curvature of the graph region in the photograph; and
   detecting horizontal and vertical lines in the warped graph region.

5. The non-transitory computer-readable medium of claim 1, the stages further including generating a report based at least in part on the stored property characteristic and the floor plan.

6. The non-transitory computer-readable medium of claim 1, the stages further including:
   determining dimensions of at least some horizontal and vertical lines in the floor plan based on a scale for grid markers; and
   storing the dimensions with the floor plan.

7. The non-transitory computer-readable medium of claim 6, wherein the scale for grid markers is determined based on detecting a user annotation in the information region.

8. The non-transitory computer-readable medium of claim 1, the stages further including:
   determining labels for rooms in the floor plan based on codes provided in the graph region by a user; and
   storing the labels with the floor plan.

9. A system for managing user mobile devices in an environment, the system comprising:
   a database that stores property information and user information;
   at least one processor that performs stages including:
      generating a first graph template for a first property based on the property information, wherein the first graph template includes an information region and a graph region in a single document, wherein generating the first graph template includes supplying different information selection options in the information region than in a second graph template that is generated for a second property, based on characteristics of the first property;
      analyzing a photograph of the information region and graph region to retrieve a property characteristic from the information region;
      vectorizing the graph region to transform a sketch into a floor plan; and
      storing the property characteristic and the floor plan with the property information in the database.

10. The system of claim 9, the stages further including printing a plurality of graph templates including the first and second graph templates in an order that is dictated by a scheduled visitation route.

11. The system of claim 9, wherein the vectorizing includes:
   scaling the graph region to a predetermined size or resolution;
   based on grid markers, warping the scaled graph region to account for curvature of the graph region in the photograph; and
   detecting horizontal and vertical lines in the warped graph region.

12. The system of claim 9, wherein the processor performs further stages including:
   determining dimensions of at least some horizontal and vertical lines in the floor plan based on a scale for grid markers; and
   storing the dimensions with the floor plan.

13. The system of claim 12, wherein the scale for grid markers is determined based on detecting a user annotation in the information region that indicates the scale.

14. The system of claim 9, wherein the processor performs further stages including:
   determining labels for rooms in the floor plan based on codes provided in the graph region by a user; and
   storing the labels with the floor plan.

15. A computer-implemented method, including:
   generating a first graph template for a first property, wherein the first graph template includes an information region and a graph region in a single document, wherein generating the first graph template includes supplying different information selection options in the information region than in a second graph template that is generated for a second property, based on characteristics of the first property;
   capturing a photograph of the information region and graph region of the first graph template;
   analyzing the photograph to retrieve a property characteristic from the information region;
   vectorizing the graph region to transform a sketch into a floor plan; and
   storing the property characteristic with the floor plan.

16. The computer-implemented method of claim 15, further including:
   printing the graph templates in order of priority, wherein the graph templates are dynamically generated to contain property-specific information selection options in the information region portions of the graph templates.

17. The computer-implemented method of claim 15, wherein the vectorizing includes:
   scaling the graph region to a predetermined size or resolution;
   based on grid markers, warping the scaled graph region to account for curvature of the graph region in the photograph; and
   detecting horizontal and vertical lines in the warped graph region.

18. The computer-implemented method of claim 17, the stages further including:
   determining dimensions of at least some horizontal and vertical lines in the floor plan based on a scale for grid markers; and
   storing the dimensions with the floor plan.

19. The computer-implemented method of claim 18, wherein the scale for grid markers is determined based on detecting a user annotation in the information region.

* * * * *